(12) United States Patent
You et al.

(10) Patent No.: US 10,353,011 B2
(45) Date of Patent: Jul. 16, 2019

(54) SYSTEM AND METHOD FOR DETECTING VOLTAGE OF BATTERY PACK

(71) Applicant: CHINA RESOURCES POWTECH (SHANGHAI) CO., LTD., Shanghai (CN)

(72) Inventors: Yong You, Shanghai (CN); Bingyin Luo, Shanghai (CN); Guocheng Li, Shanghai (CN); Jianmin Li, Shanghai (CN); Linhai Xu, Shanghai (CN); Lei Zhang, Shanghai (CN); Huiyuang Ren, Shanghai (CN); Yujie Wang, Shanghai (CN); Jin Li, Shanghai (CN)

(73) Assignee: CHINA RESOURCES POWTECH (SHANGHAI) CO., LTD., Shanghai (CN)

( * ) Notice: Subject to any disclaimer, the term of this patent is extended or adjusted under 35 U.S.C. 154(b) by 217 days.

(21) Appl. No.: 15/514,332

(22) PCT Filed: Dec. 31, 2014

(86) PCT No.: PCT/CN2014/095906
§ 371 (c)(1),
(2) Date: Mar. 24, 2017

(87) PCT Pub. No.: WO2016/082290
PCT Pub. Date: Jun. 2, 2016

(65) Prior Publication Data
US 2017/0292997 A1  Oct. 12, 2017

(30) Foreign Application Priority Data

Nov. 27, 2014  (CN) .......................... 2014 1 0707016

(51) Int. Cl.
*G01R 19/00* (2006.01)
*H01M 10/48* (2006.01)
*G01R 31/3835* (2019.01)

(52) U.S. Cl.
CPC ......... *G01R 31/3835* (2019.01); *G01R 19/00* (2013.01); *H01M 10/482* (2013.01)

(58) Field of Classification Search
CPC ........ H02J 7/0068; H02J 7/0063; H02J 7/022; H02J 7/025; H02J 2007/0067; H02J 3/383;
(Continued)

(56) References Cited

U.S. PATENT DOCUMENTS

2007/0285083 A1* 12/2007 Kamata .............. G01R 31/3835
324/120

FOREIGN PATENT DOCUMENTS

CN    1290862 A    4/2001
CN    1731207 A    2/2006
(Continued)

*Primary Examiner* — Drew A Dunn
*Assistant Examiner* — Sailesh Thapa
(74) *Attorney, Agent, or Firm* — Global IP Services; Tianhua Gu

(57) ABSTRACT

A system and method for detecting voltage of a battery pack. The system comprises a level transfer circuit array, a multipath data selector, a decoder, a trimming calibration circuit, and an output buffer. The decoder is configured to parse a battery pack cell gating signal; the level transfer circuit array is configured to convert a gated battery pack cell voltage into a common grounded voltage; the multipath data selector is configured to transmit the common grounded voltage, which is converted by the level transfer circuit array, of a battery pack cell to the trimming calibration circuit; the trimming calibration circuit is configured to correct the received common grounded voltage of the battery pack cell; and the output buffer is configured to buffer the common grounded
(Continued)

voltage, which is trimmed and calibrated by the trimming calibration circuit, of the battery pack cell.

8 Claims, 3 Drawing Sheets

(58) Field of Classification Search
CPC .. H02J 50/10; H02J 50/12; H02J 50/70; H02J 5/005; H02J 7/0042; H02J 7/0044; H02J 7/0052; H02J 7/0081; H02J 7/045; H02J 7/06; G01R 31/2822; G01R 31/2825; G01R 31/3865; G01R 31/3835; G01R 19/00; H01M 10/482
See application file for complete search history.

(56) References Cited

FOREIGN PATENT DOCUMENTS

| | | | |
|---|---|---|---|
| CN | 101043094 A | | 9/2007 |
| CN | 101256208 A | | 9/2008 |
| CN | 101876670 | * | 11/2010 |
| CN | 101876670 A | | 11/2010 |
| JP | 2013015334 A | | 1/2013 |

* cited by examiner

SYSTEM AND METHOD FOR DETECTING VOLTAGE OF BATTERY PACK

CROSS REFERENCE TO RELATED PATENT APPLICATION

The present application is the US national stage of PCT/CN2014/095906 filed on Dec. 31, 2014, which claims the priority of the Chinese patent application No. 201410707016.6 filed on Nov. 27, 2014, which applications are incorporated herein by reference.

FIELD OF INVENTION

The present invention relates to the field of electronic circuit technologies, and in particular, to a system and method for detecting voltage of a battery pack.

DESCRIPTION OF RELATED ARTS

When large-power lithium batteries are applied, 3 to 6 or even more battery pack cells usually need to be formed into a battery pack by series-parallel connection, so as to obtain higher output voltages and larger capacity. Existence of cell internal resistance results in inconsistency between charging and discharging rates of the cells in the battery pack; in less severe cases, the cells, as well as the battery pack, are damaged, and in severe cases, safety incidents, such as fire explosion are even caused. Therefore, each cell in the battery pack needs to be detected, so as to find individual over-charged or over-discharged cells in time, and adopt corresponding protective measures.

Over-charged or over-discharged states of the cells are represented by cell voltages. Because the cells are connected in series, it is detected that the battery pack cell voltage is floating-biased. To process the floating-bias voltage, the floating-bias voltage needs to be converted into a common grounded voltage by a battery pack voltage detection system, to facilitate subsequent processing. The battery pack voltage detection system needs high precision. If sampling precision is insufficient, the sampled common grounded voltage is greater than or less than an actual voltage of the cell of the battery pack, and consequently, a subsequent processing circuit makes wrong judgment; in less severe cases, the battery pack is damaged, and in severe cases, safety incidents are caused.

In addition, because application scenarios of the battery pack are mainly portable applications, and have high requirements for standby time and standby power consumption, the battery pack voltage detection system must maintain low power consumption in work and sleep.

In the prior art, there are mainly two methods for battery pack voltage detection: a lithium battery pack voltage detection system constructed based on a level transfer circuit, and a switch network based battery pack voltage detection system.

Specifically, a Chinese utility model with Publication No. CN202281798U and entitled VOLTAGE SAMPLING CIRCUIT FOR BATTERY PACK, discloses a voltage sampling circuit for a battery pack constructed based on a level transfer circuit, which includes a battery pack formed by connecting several batteries in series; the battery pack includes a first battery and a second battery; a negative electrode of the first battery is grounded; a first voltage output unit; negative and positive electrodes of the first battery are separately connected to two input ends of the first voltage output unit; a voltage sampling unit; an output end of the first voltage output unit is connected to a first end of the voltage sampling unit by a first switch, and a second end of the voltage sampling unit is grounded; a second voltage output unit; negative and positive electrodes of the second battery are separately connected to two input ends of the second voltage output unit, and an output end of the second voltage output unit is connected to a third end of the voltage sampling unit by a second switch; and a differential circuit, which includes an operational amplifier, a first resistor, a second resistor, a third resistor, and a fourth resistor; the negative electrode of the second battery is connected to a reverse input end of the operational amplifier by the first resistor; the positive electrode of the second battery is connected to a forward input end of the operational amplifier by the second resistor; the reverse input end of the operational amplifier is connected to an output end of the operational amplifier by the third resistor; the forward input end of the operational amplifier is grounded by the fourth resistor; and the output end of the operational amplifier is connected to a fourth end of the voltage sampling unit.

A Chinese patent for invention with Publication No. CN102331561A and entitled BATTERY VOLTAGE DETECTION CIRCUIT AND BATTERY MANAGEMENT SYSTEM, discloses a switch network based battery pack voltage detection system, which includes multiple switch units; input ends of the multiple switch units are sequentially connected in one-to-one correspondence to positive electrodes of multiple individual batteries connected in series in a battery pack to be detected; the multiple switch units are sequentially arranged in an odd-even manner from a negative electrode to a positive electrode of the battery pack to be detected, and are used to perform turn-on or turn-off under control of a control signal; a first operational amplifying unit; a forward input end of the first operational amplifying unit is connected to output ends of the odd-numbered switch units; a reverse input end of the first operational amplifying unit is connected to output ends of the even-numbered switch units, to sample voltages of the corresponding odd-numbered individual batteries when the switch units are turn-on, so as to output a first sampling voltage; a second operational amplifying unit; a forward input end of the second operational amplifying unit is connected to the output ends of the even-numbered switch units; a reverse input end of the second operational amplifying unit is connected to the output ends of the even-numbered switch units, to sample voltages of the corresponding even-numbered individual batteries when the switch units are turn-on, so as to output a second sampling voltage; a control unit; multiple input ends of the control unit are separately connected to an output end of the first operational amplifying unit and an output end of the second operational amplifying unit; multiple output ends of the control unit are separately connected to control ends of the switch units, and are used to output the control signal after power supply to control the turn-on or turn-off of the switch units, and perform analog-to-digital conversion on the first sampling voltage or the second sampling voltage; and a power supply conversion unit; an input end of the power supply conversion unit is connected to the positive electrode of the battery pack to be detected; an output end of the power supply conversion unit is connected to a power supply end of the control unit; a control end of the power supply conversion unit is connected to an output end of an external switch control unit, and is used to provide a stable working power supply for the control unit.

However, although the existing battery pack voltage detection system can complete signal sampling work of a battery pack cell voltage, it still has great deficiency in the following aspects:

1. Power Consumption Control

In the aspect of power consumption control, all level transfer modules and switch network control modules of either a battery pack voltage detection system constructed based on a level transfer circuit or a switch network based battery pack voltage detection system are in working state, regardless of whether the modules are gated; however, in the entire system, the level transfer modules and the switch network control modules consume most current, and therefore cannot be competent at low power consumption applications.

2. Precision Conversion

A device mismatch is caused due to manufacturing technologies, and leads to offset voltages. The voltage output unit, the amplifier, the voltage sampling unit, and the switch units in the above detection system inevitably introduce errors, which may be fatal to the system formed by batteries, and the above detection system does not process the errors on the aspect.

3. System Reliability

Because a highest voltage of a battery is 4.2V, the voltage output unit and the switch units in the above detection system are both constructed based on low voltage withstanding devices. However, in a case in which the battery pack is charged, if one of the battery pack cells is open-circuit, a voltage at the cell greatly increases to exceed a voltage withstanding range of the low voltage withstanding devices, and consequently leading to system failure and potential safety hazards.

SUMMARY OF THE PRESENT INVENTION

In view of the above disadvantages of the prior art, an object of the present invention is to provide a battery pack voltage detection system and a battery pack voltage detection method, so as to resolve the problems that existing voltage detection circuits have large static power consumption, low battery conversion precision, and cannot perform self-protection under abnormal working conditions.

In order to accomplish the above object and other relevant objects, the present invention provides a battery pack voltage detection system, comprising a decoder, a level transfer circuit array, a multipath data selector, a trimming calibration circuit, and an output buffer; the decoder is configured to parse a battery pack cell gating signal; the level transfer circuit array is connected to the decoder to convert a corresponding battery pack cell voltage into a common grounded voltage under control of the battery pack cell gating signal; the multipath data selector is connected to the decoder and the level transfer circuit array to transmit the common grounded voltage, which is converted by the level transfer circuit array, of a battery pack cell to the trimming calibration circuit according to the battery pack cell gating signal; the trimming calibration circuit is connected to the decoder and the multipath data selector to correct the received common grounded voltage of the battery pack cell; and the output buffer is connected to the trimming calibration circuit to buffer the common grounded voltage, which is trimmed and calibrated by the trimming calibration circuit, of the battery pack cell.

According to the above battery pack voltage detection system, the level transfer circuit array comprises an enable generation circuit and several sampling units; the enable generation circuit is configured to generate an enable signal, which corresponds to a sampling unit, of a gated channel according to the battery pack cell gating signal; the sampling unit is configured to convert a battery pack cell voltage of the gated channel into a common grounded voltage according to the enable signal, which corresponds to the sampling unit, of the gated channel.

Further, according to the above battery pack voltage detection system, positive and negative electrodes of the several sampling units are sequentially connected end to end, and positive and negative electrodes of each battery pack cell are separately connected to positive and negative ends of a corresponding sampling unit.

According to the above battery pack voltage detection system, the trimming calibration circuit comprises a programmable calibration code register and a programmable gain amplifier; the programmable calibration code register is configured to store a trimming and calibration code of each channel; and the programmable gain amplifier is configured to correct the common grounded voltage of the battery pack cell according to amplified gain corresponding to the trimming and calibration code corresponding to the battery pack cell gating signal.

According to the above battery pack voltage detection system, the sampling unit comprises a sampling unit enable circuit, a high side bleeder circuit, a voltage-to-current circuit, and a voltage reduction circuit;

the sampling unit enable circuit comprises an enable generation circuit, a first current source, and a second current source; the enable generation circuit is separately connected to the first current source and the second current source to enable the first current source and the second current source; the first current source is configured to provide current for the voltage-to-current circuit, and the second current source is configured to provide current for the high side bleeder circuit;

the high side bleeder circuit comprises a first voltage divider resistor string, a second voltage divider resistor string, and a mirror current source; after the first voltage divider resistor string, the second voltage divider resistor string and the mirror current source are sequentially connected in series, two ends are separately connected to positive and negative input ends of the sampling unit;

the voltage-to-current circuit comprises an operational amplifier, a PMOS transistor, and a third resistor; a positive input end of the operational amplifier is connected to a point, where the first voltage divider resistor string is connected to the second voltage divider resistor string; a negative input end of the operational amplifier is connected to a drain of the PMOS transistor; an output end of the operational amplifier is connected to a gate of the PMOS transistor; a source of the PMOS transistor is connected to the voltage reduction circuit; one end of the third resistor is connected to the positive input end of the sampling unit, and the other end of the third resistor is connected to the drain of the PMOS transistor; and the voltage reduction circuit comprises a fourth resistor, and one end of the fourth resistor is connected to the source of the PMOS transistor, and the other end of the fourth resistor is grounded.

At the same time, the present invention further provides a battery pack voltage detection method, comprising the following steps:

step S1, parsing, by a decoder, a battery pack cell gating signal;

step S2, generating, by a level transfer circuit array, an enable signal, which corresponds to a sampling unit, of a gated channel according to the battery pack cell gating signal, and under control of the signal, converting a floating-bias voltage of a battery pack cell of the gated channel into a common grounded voltage;

step S3, transmitting, by a multipath data selector, the converted common grounded voltage of the battery pack cell of the gated channel to a trimming calibration circuit according to a battery pack channel selection signal;

step S4, correcting, by the trimming calibration circuit, the received common grounded voltage of the battery pack cell; and step S5, buffering, by an output buffer, the trimmed and calibrated common grounded voltage of the battery pack cell.

According to the above battery pack voltage detection method, the battery pack cell gating signal comprises a gating signal of a channel cell voltage, a low power consumption module signal, and a high speed sampling mode signal;

the level transfer circuit array comprises an enable generation circuit and several sampling units; the enable generation circuit is configured to generate an enable signal, which corresponds to a sampling unit, of a gated channel according to the battery pack cell gating signal; the sampling unit is configured to convert a battery pack cell voltage of the gated channel into a common grounded voltage according to the enable signal, which corresponds to the sampling unit, of the gated channel; and the trimming calibration circuit comprises a programmable calibration code register and a programmable gain amplifier; the programmable calibration code register is configured to store a trimming and calibration code of each channel; and the programmable gain amplifier is configured to correct the common grounded voltage of the battery pack cell according to amplified gain corresponding to the trimming and calibration code corresponding to the battery pack cell gating signal.

According to the above battery pack voltage detection method, the sampling unit comprises a sampling unit enable circuit, a high side bleeder circuit, a voltage-to-current circuit, and a voltage reduction circuit;

the sampling unit enable circuit comprises an enable generation circuit, a first current source, and a second current source; the enable generation circuit is separately connected to the first current source and the second current source to enable the first current source and the second current source; the first current source is configured to provide current for the voltage-to-current circuit, and the second current source is configured to provide current for the high side bleeder circuit;

the high side bleeder circuit comprises a first voltage divider resistor string, a second voltage divider resistor string, and a mirror current source; after the first voltage divider resistor string, the second voltage divider resistor string, and the mirror current source are sequentially connected in series, two ends are separately connected to positive and negative input ends of the sampling unit;

the voltage-to-current circuit comprises an operational amplifier, a PMOS transistor, and a third resistor; a positive input end of the operational amplifier is connected to a point, where the first voltage divider resistor string is connected to the second voltage divider resistor string; a negative input end of the operational amplifier is connected to a drain of the PMOS transistor; an output end of the operational amplifier is connected to a gate of the PMOS transistor; a source of the PMOS transistor is connected to the voltage reduction circuit; one end of the third resistor is connected to the positive input end of the sampling unit, and the other end of the third resistor is connected to the drain of the PMOS transistor; and the voltage reduction circuit comprises a fourth resistor, and one end of the fourth resistor is connected to the source of the PMOS transistor, and the other end of the fourth resistor is grounded.

Further, according to the above battery pack voltage detection method, the common grounded voltage $V_{OUT}$, which is converted and obtained by the sampling unit, of the battery pack cell is:

$$V_{OUT} = V_{bat} \frac{R_{1214} \times R_{1219}}{(R_{1214} + R_{1215}) \times R_{1218}}$$

$V_{bat}$ is a voltage value provided by a battery pack; $R_{1214}$, $R_{1215}$, $R_{1218}$, and $R_{1219}$ are respectively resistance values of the first voltage divider resistor string, the second voltage divider resistor string, the third resistor, and the fourth resistor.

As stated above, the battery pack voltage detection system and the battery pack voltage detection method of the present invention have the following beneficial effects:

(1) by controlling a sampling unit, a data selector, and a trimming circuit by a gating signal, only a needed circuit relevant with battery voltage sampling is switched on, so as to greatly reduce system power consumption under a precondition of ensuring a conversion speed;

(2) offset voltages of the sampling unit, the data selector, and the trimming circuit are adjusted by using the trimming circuit, to ensure high precision of output voltages; and (3) system reliability is improved by using a sampling unit formed by high voltage withstanding devices; when a battery is open-circuit in charging, an output voltage is converted into a system power supply voltage (a voltage much higher than a battery voltage) at the battery, to indicate an abnormality for a subsequent processing circuit to facilitate processing.

DETAILED DESCRIPTION OF THE PREFERRED EMBODIMENTS

Implementation manners of the present invention are described below by using specific examples, and a person skilled in the art can easily understand other advantages and effects of the present invention according to content disclosed by the present specification. The present invention may be further implemented or applied in other different specific implementation manners. Various modifications or variations may also be made on details in the present specification based on different viewpoints and applications without departing from the spirit of the present invention.

It should be noted that figures provided in this embodiment describe basic concepts of the present invention only in an illustrative manner, and therefore the figures shown only related components in the present invention, and are not drawn according to quantities, shapes, and sizes of the components in actual implementation. In actual implementation, forms, quantities, and ratios of the components may be arbitrarily changed, and layout forms of the components may be more complicated.

A battery pack voltage detection system of the present invention may be applied to battery management systems of various types, and can implement voltage detection and achieve the technical effect of high precision and low power consumption at the same time. In the present invention, a battery back refers to a system formed by connecting two or more battery pack cells end to end in series; and sometimes, to increase capacity under conditions of rated output voltages, the system may also be formed in a form of first connecting multiple battery pack cells in parallel and then connecting the multiple battery pack cells end to end in series.

Figure 1:
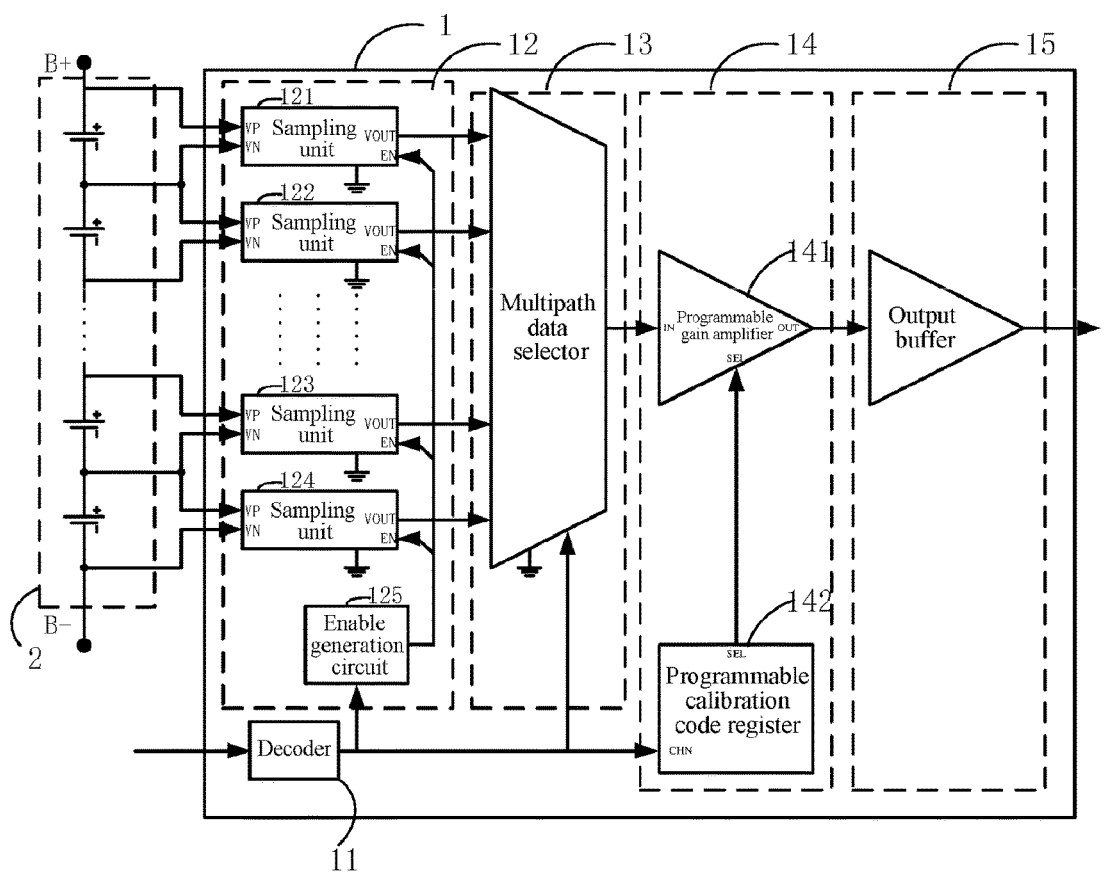
FIG. 1 is a schematic structural diagram of a battery pack voltage detection system of the present invention.

The battery pack voltage detection system of the present invention converts a floating-bias voltage of each battery pack cell in a battery back into a common grounded voltage to facilitate subsequent signal processing. Input signals of the system are positive and negative electrodes of each battery pack cell, and a channel selection signal in the battery back; and an output signal of the system is a battery pack cell voltage converted into common grounded level. Referring to FIG. 1, a battery pack voltage detection system 1 of the present invention detects voltage of a battery pack 2, and comprises a decoder 11, a level transfer circuit array 12, a multipath data selector 13, a trimming calibration circuit 14, and an output buffer 15.

The decoder 11 is configured to parse a battery pack cell gating signal. Because the battery pack 2 may be formed by multiple cells, to save system port resources, the cells are encoded, and then the decoder in the system decodes cells corresponding to codes, so as to perform sampling conversion. When the system detects that of the number of the battery pack cells is small, or when the port resources are rich, the battery pack cell gating signal can directly perform control without decoding by the decoder.

An input of the level transfer circuit array 12 is connected to an output of the decoder 11 and a joint of the battery pack cells, to convert the corresponding battery pack cell voltage into a common grounded voltage under control of the battery pack cell gating signal. Specifically, the level transfer circuit array 12 comprises an enable generation circuit 125 and several sampling units (for example, a sampling unit 121, and sampling units 122 to 124 shown in FIG. 1). The enable generation circuit 125 is configured to generate an enable signal, which corresponds to a sampling unit, of a gated channel according to the battery pack cell gating signal. The sampling unit converts a floating-bias voltage of each battery pack cell of the gated channel into a common grounded voltage according to the signal. The number of the sampling units is equal to or greater than the number of the battery pack cells in the battery pack. Under permission of voltage withstanding devices, positive and negative input ends (VP, VN) of the sampling units are sequentially connected end to end to form a sampling array string, and are connected in one-to-one correspondence to the battery pack cells that are sequentially connected in series in the battery pack. If the number of the sampling units is greater than the number of the battery pack cells in the battery pack, remaining sampling units are not connected. That is, positive and negative electrodes of the sampling units are sequentially connected end to end, and positive and negative electrodes of each battery pack cell are respectively connected to positive and negative ends of a corresponding sampling unit. In specific operation, the enable generation circuit converts the battery pack cell gating signal decoded by the decoder into an enable signal that can be identified by the sampling units. The sampling units work only when the gating signal is enabled, and are in standby state at other times, and do not consume current, so as to reduce system power consumption.

The mode is a low power consumption sampling mode; that is, in one sampling period, only a sampling unit corresponding to a specified battery pack cell works; in this case, a corresponding channel of the multipath data selector is opened, and outputs a sampling signal to the trimming calibration circuit, to complete subsequent signal conditioning. In addition, to implement low power consumption of the system, a dedicated sampling unit circuit may also be used, to implement balance between speed and precision. The dedicated sampling unit circuit will be subsequently described in detail.

An input of the multipath data selector 13 is connected to the output of the decoder 11 and an output of the level transfer circuit array 12, to perform transmission according to the battery pack cell gating signal decoded by the decoder 11; in a high speed working mode, all the sampling units work in any sampling period; only when the battery pack cell gating signal is provided, the multipath data selector opens the corresponding channel, to transmit the common grounded voltage, which is converted by the level transfer circuit array 12, of each battery pack cell to the trimming calibration circuit 14, and complete subsequent signal conditioning.

An input of the trimming calibration circuit 14 is connected to the output of the decoder 11 and an output of the multipath data selector 13, to correct the received common grounded voltage of each battery pack cell, to remove an offset voltage and a transmission loss voltage in a previous circuit. Specifically, the trimming calibration circuit 14 comprises a programmable calibration code register 142 and a programmable gain amplifier 141. The programmable calibration code register 142 is configured to store a trimming and calibration code of each channel. The programmable gain amplifier 141 is configured to correct the common grounded voltage of the battery pack cell according to amplified gain corresponding to the trimming and calibration code. An SEL end of the programmable calibration code register 142 is connected to an SEL end of the programmable gain amplifier 141, and amplified gain of the programmable gain amplifier 141 is controlled and selected by the SEL end. When the trimming calibration circuit works, the programmable calibration code register 142 selects the trimming and calibration code of a corresponding channel according to the battery pack cell gating signal decoded by the decoder, and then the programmable gain amplifier 141 corrects the common grounded voltage of the battery pack cell according to the amplified gain corresponding to the trimming and calibration code, to remove offset and transmission errors.

The output buffer 15 is connected to the trimming calibration circuit 14 to buffer the common grounded voltage, which is trimmed and calibrated by the trimming calibration circuit 14, of the battery pack cell, so as to improve a signal loading capacity, thereby driving resistive or capacity load outside the system.

The output buffer 15 may select a device that can implement a signal buffering function, for example, an operational amplifier. An output signal loading capacity may be adjusted according to peripheral system requirements.

Figure 2:
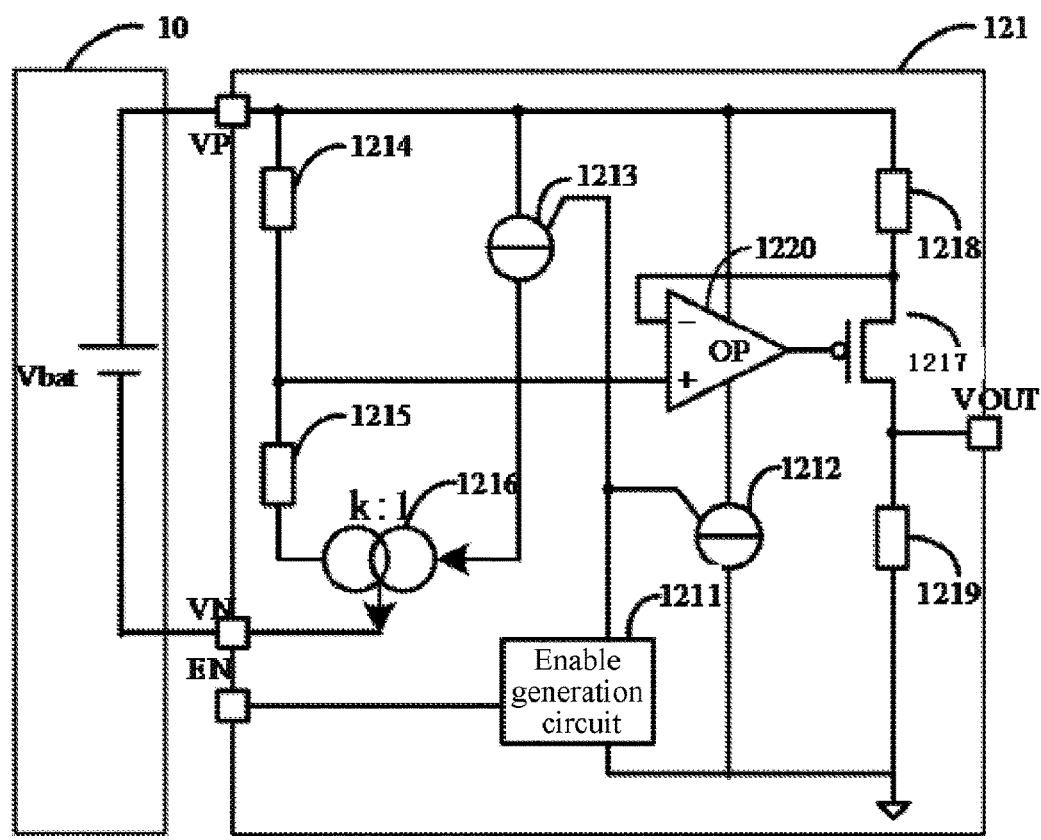
FIG. 2 is a schematic structural diagram of a circuit of a sampling unit in a level transfer circuit array of the present invention.

FIG. 2 is a schematic structural diagram of a circuit of a sampling unit in a level transfer circuit array of the present invention. For ease of description, only parts relevant with the invention are shown.

Specifically, the sampling unit 121 comprises a sampling unit enable circuit, a high side bleeder circuit, a voltage-to-current circuit, and a voltage reduction circuit.

The sampling unit enable circuit comprises an enable generation circuit 1211, a first current source 1212, and a second current source 1213. The enable generation circuit 1211 is separately connected to the first current source 1212 and the second current source 1213, to enable the first current source 1212 and the second current source 1213. The first current source 1212 is configured to provide current for the voltage-to-current circuit; one end is connected to a positive input end of the sampling unit, and the other end is connected to the mirror current source. The second current source 1213 is configured to provide current for the high side bleeder circuit, so as to enable the high side bleeder circuit. One end is connected to the operational amplifier, and the other end is grounded.

The high side bleeder circuit comprises a first voltage divider resistor string 1214, a second voltage divider resistor string 1215, and a mirror current source 1216. After the first voltage divider resistor string 1214, the second voltage divider resistor string 1215, and the mirror current source 1216 are sequentially connected in series, two ends are separately connected to positive and negative input ends of the sampling unit. A ratio between the first resistor string 1214 and the second resistor string 1215 and resistance values thereof may be set according to system requirements. A ratio of the mirror current source 1216 is k, so as to ensure that the mirror current source tube 1216 can be sufficiently opened when the current of the second current source 1213 is small. Because the resistance values of the first voltage divider resistor string 1214 and the second voltage divider resistor string 1215 are quite larger with respect to on-resistance of the mirror current source 1216, it can be considered that the on-resistance of the mirror current source tube 1216 does not affect a voltage dividing ratio.

The voltage-to-current circuit comprises an operational amplifier 1220, a PMOS transistor 1217, and a third resistor 1218. A positive input end of the operational amplifier is connected to a point, where the first voltage divider resistor string 1214 is connected to the second voltage divider resistor string 1215; a negative input end of the operational amplifier is connected to a drain of the PMOS transistor; an output end of the operational amplifier is connected to a gate of the PMOS transistor; a source of the PMOS transistor is connected to the voltage reduction circuit; one end of the third resistor is connected to the positive input end of the sampling unit, and the other end of the third resistor is connected to the drain of the PMOS transistor. A divided voltage of the high side bleeder circuit is converted into a path of current to ground by negative feedback, to facilitate common grounded signal reduction.

The voltage reduction circuit comprises a fourth resistor 1219. One end of the fourth resistor is connected to the source of the PMOS transistor, and the other end of the fourth resistor is grounded. When current of the voltage-to-current circuit flows through the fourth resistor, a voltage signal to ground is generated, so as to complete sampling of the battery pack cell voltage.

When the sampling unit performs enabling work, the enable generation circuit in the sampling unit provides a control signal to open the first current source 1212 and the second current source 1213; current that flows out of the second current source 1213 is mirrored by the mirror current source 1216, and then one path of divided voltages of the resistors is opened; because the mirror ratio k is large and the resistance values of the first voltage divider resistor 1214 and the second voltage divider resistor 1215 are great, the on-resistance of the mirror current source 1216 may be ignored, so as to ensure an accurate voltage dividing ratio of the resistors. Divided voltages of the first voltage divider resistor 1214 and the second voltage divider resistor 1215 are transferred to the positive input end of the operational amplifier 1220 in the voltage-to-current circuit, and a divided voltage, which is transferred to the positive input end of the operational amplifier, of the battery pack cell is:

$$V_{1220+} = V_{bat} \times \frac{R_{1215}}{R_{1214} + R_{1215}} \quad (1)$$

$V_{bat}$ is a voltage value provided by the battery pack.

The voltage-to-current circuit is a closed-loop system; voltages on two ends of the operational amplifier are equal, that is:

$$V_{1220-} = V_{1220+} = V_{bat} \times \frac{R_{1215}}{R_{1214} + R_{1215}} \quad (2)$$

Therefore, Current $I_{sample}$ that flows through the resistor R1218 is:

$$I_{sample} = \frac{V_{bat} - V_{1220-}}{R_{1218}} = V_{bat} \frac{R_{1214}}{(R_{1214} + R_{1215}) \times R_{1218}} \quad (3)$$

In this way, the floating-biased battery pack cell voltage is converted into a common grounded current signal.

The common grounded current signal flows through the common grounded resistor 1219, so as to convert the floating-biased battery pack cell voltage into a common grounded signal of the battery pack cell, that is:

$$V_{OUT} = I_{sample} \times R_{1219} = V_{bat} \frac{R_{1214} \times R_{1219}}{(R_{1214} + R_{1215}) \times R_{1218}} \quad (4)$$

Based on the above, the floating-biased battery pack cell voltage can be converted into any needed common grounded signal only by adjusting a ratio among the resistors 1214, 1215, 1218, and 1219. Precision of the common grounded signal of the battery pack cell voltage is relevant with only the resistors and a matching degree between the resistors 1214 and 1215, and the resistors 1218 and 1219. Therefore, sampling precision may not be affected by the battery pack cell voltage. Even the battery pack cell voltage is close to 0V, the sampling unit can also perform precise conversion, so as to greatly improve a sampling range.

Working current of the sampling unit is provided by the battery pack cell and three are three paths of the working current of the sampling unit in total, that is, the first voltage divider resistor string 1214, the second voltage divider resistor string 1215, and the mirror current source 1216 in the high side bleeder circuit use one path of current; the operational amplifier 1220 in the voltage-to-current circuit uses one path of current; and the voltage reduction circuit 1219 uses one path of current; wherein, the operational amplifier may be designed to use low working current, and working current of the high side bleeder circuit and working current of the voltage reduction circuit are mainly determined by respective resistance values; overall working current of the sampling unit can be well controlled by reasonably setting resistance values.

When the sampling unit is in switch-off state, the first current source 1212 and the second current source 1213 do not provide working current; the high side bleeder circuit and the voltage-to-current circuit are in switch-off state and do not consume power. Because the high side bleeder circuit is in switch-off state, a divided voltage $V_{1220+}$ is equal to a voltage on a positive electrode of the battery pack cell; according to formula (3), it can be known that the path of the voltage reduction circuit has no quiescent current, so that circuits inside an entire module are in switch-off state in a case in which the sampling module circuit is switched off, and power consumption is approximately zero, so as to greatly reduce system power consumption.

MOS transistors used by the sampling unit are all high voltage withstanding devices, and can bear high voltages on drains and sources. Because an optimized circuit structure is used, voltage withstanding is not needed between a gate and the source of the MOS transistor, and therefore a thin gate-oxide device may be used to reduce costs. When the battery pack is open-circuit in a charging process, a high voltage occurs on two ends of an open-circuit battery pack cell; after converting the high voltage, the sampling unit outputs a sampling voltage signal much higher than a normal battery pack cell voltage. The signal may be used to prompt a battery pack system fault.

The battery pack cell voltage signal converted by the sampling unit needs to be gated by a multichannel data selector. In the present invention, the multichannel data selector comprises a switch with enable control. The switch may be any device that can transmit analog signals, for example, a transmission gate, or an MOS transistor; an enable end of the switch is provided by the battery pack voltage detection system with high precision and low power consumption; a channel enabled by the switch is one-to-one corresponding to a channel enabled by the level transfer circuit array.

Errors are introduced when the sampling unit converts the battery pack cell voltage and the multichannel data selector performs signal transmission. For example, offsets brought by match of the resistors 1214, 1215, 1218, and 1219 in the sampling unit, or an offset voltage of the operational amplifier 1220 itself affects sampling precision of the battery pack cell. The trimming calibration circuit 14 trims and calibrates these errors, so as to ensure accuracy of the entire system.

Figure 3:
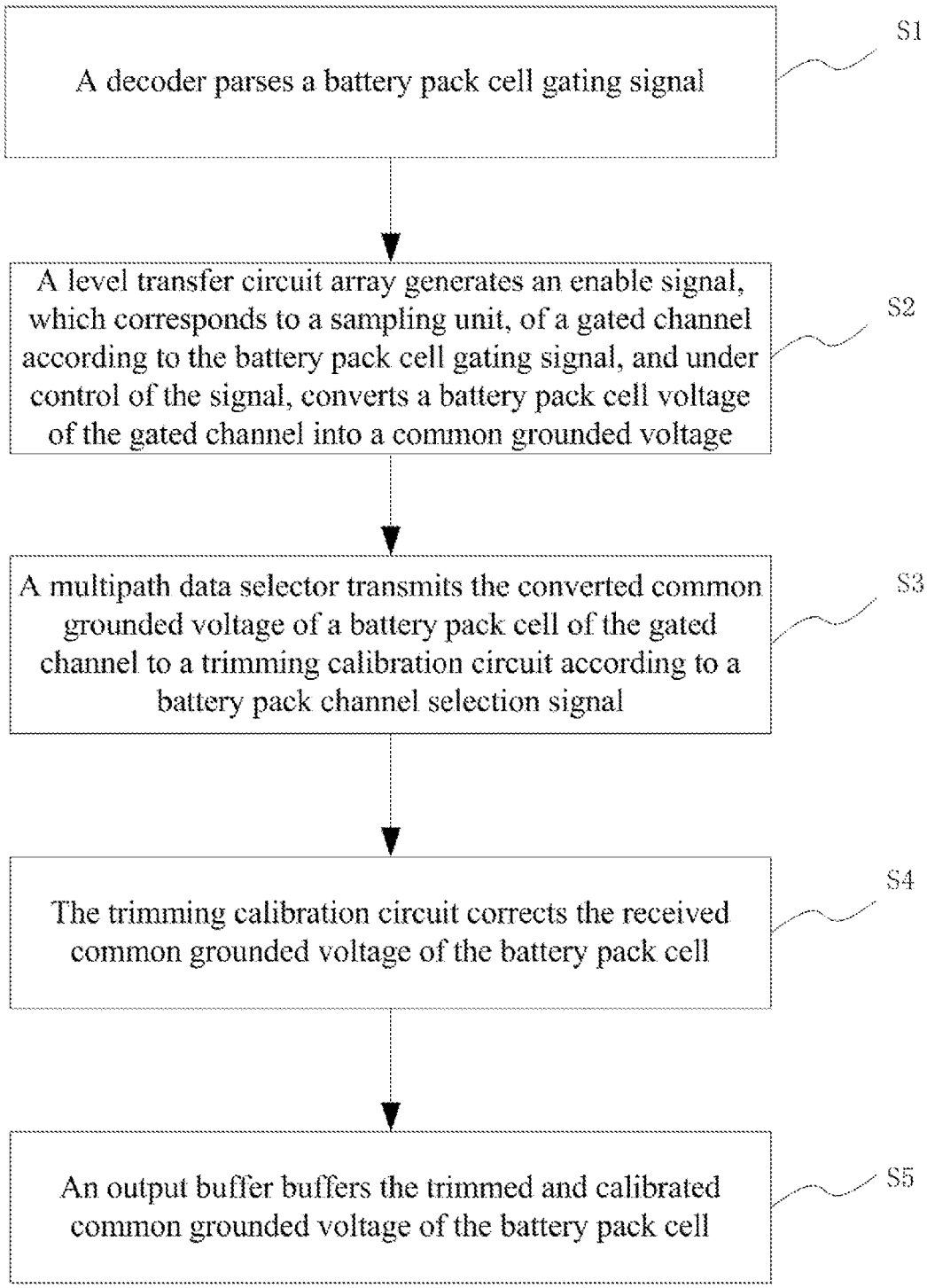
FIG. 3 is a flowchart of a battery pack voltage detection method of the present invention.

As shown in FIG. 3, in a battery pack voltage detection method of the present invention, a floating-biased signal of a voltage of each battery pack cell in a battery pack is converted into a common grounded signal by a level transfer circuit array with low power consumption, and then a multipath data selector completes offset and error trimming and calibration in a trimming and calibration circuit, to form a sampling signal with high precision, and then a loading capacity is improved by an output buffer, to finally complete high-precision sampling processing on the voltage of each battery pack cell in the battery pack. The battery pack voltage detection method specifically comprises the following steps:

step S1: A decoder parses a battery pack cell gating signal.

Specifically, an external system provides a specified channel conversion signal, which comprises but is not limited to logical level, a level signal that satisfies each communications standard, and a battery pack cell voltage. The specified channel conversion signal converts a battery pack cell gating signal by a decoder, and provides a gating signal for a subsequent sampling unit, a multipath data selector, and a programmable calibration code register.

The battery pack cell gating signal comprises a gating signal of a channel cell voltage, a low power consumption module signal, and a high speed sampling mode signal.

Under the low power consumption module signal, a system switches off all sampling units, and stops sampling a battery pack, to reduce system power consumption, and this is suitable to system standby state.

Under the high speed sampling mode signal, the system opens all the sampling units, and performs trimming output on a specified cell voltage only by the multipath data selector, to reduce conversion time of the signal in the sampling units, and consume a part of working current to achieve an effect of high speed sampling.

Step S2: A level transfer circuit array generates an enable signal, which corresponds to a sampling unit, of a gated channel according to the battery pack cell gating signal, and under control of the signal, converts a battery pack cell voltage of the gated channel into a common grounded voltage.

Specifically, the battery pack cell gating signal decoded by the decoder is converted into an enable signal, which corresponds to a sampling unit, of a gated channel, where the enable signal can be identified by the sampling units. The sampling units work only when gating signals of corresponding channels are enabled, and are in standby state at other times, and do not consume current, so as to reduce system power consumption.

Step S3: A multipath data selector transmits the converted common grounded voltage of a battery pack cell of the gated channel to a trimming calibration circuit according to a battery pack channel selection signal.

Step S4: The trimming calibration circuit corrects the received common grounded voltage of the battery pack cell.

An offset voltage and a transmission loss voltage in a previous circuit can be removed by correcting the received common grounded voltage of the battery pack cell. Each path of the sampling units and trimming and calibration codes accumulated in transmission paths thereof are stored in a programmable calibration code register. When the trimming calibration circuit works, the programmable calibration code register selects a trimming and calibration code of a corresponding channel according to the battery pack cell gating signal decoded by the decoder, and then a programmable gain amplifier trims the common grounded voltage of a corresponding battery pack cell according to the trimming and calibration code, to remove offset and transmission errors.

Step S5: An output buffer buffers the trimmed and calibrated common grounded voltage of the battery pack cell.

A signal loading capacity can be improved by the above buffering processing, so as to drive resistive or capacitive load outside the system.

Based on the above, according to the battery pack voltage detection system and the battery pack voltage detection method of the present invention, a sampling unit, a data selector, and a trimming circuit are controlled by a gating signal, and only a needed circuit relevant with battery voltage sampling is switched on, to greatly reduce system power consumption under a precondition of ensuring a conversion speed; offset voltages of the sampling unit, the data selector, and the trimming circuit are adjusted by using the trimming circuit, to ensure high precision of output voltages; sampling units are formed by using high voltage withstanding devices to improve system reliability; when a battery is open-circuit in charging, an output voltage is converted into a system power supply voltage at the battery, to indicate an abnormality for a subsequent processing circuit to facilitate processing. Therefore, the present invention effectively overcomes various disadvantages in the prior art and has high industrial utilization values.

The above embodiments merely exemplarily describe the principles and effects of the present invention, and are not intended to limit the present invention. Any person skilled in the art can modify or change the above embodiments without departing from the spirit or scope of the present invention. Therefore, all equivalent modifications or variations completed by those with ordinary skill in the art without departing from the spirit and technical idea disclosed in the present invention should fall within the scope of the claims of the present invention.

What is claimed is:

1. A battery pack voltage detection system, comprising a decoder, a level transfer circuit array, a multipath data selector, a trimming calibration circuit, an output buffer and a sampling unit;
   the decoder is configured to parse a battery pack cell gating signal;
   the level transfer circuit array is connected to the decoder, to convert a corresponding battery pack cell voltage into a common grounded voltage under control of the battery pack cell gating signal;
   the multipath data selector is connected to the decoder and the level transfer circuit array, to transmit the common grounded voltage, which is converted by the level transfer circuit array, of a battery pack cell to the trimming calibration circuit according to the battery pack cell gating signal;
   the trimming calibration circuit is connected to the decoder and the multipath data selector, to correct the received common grounded voltage of the battery pack cell; and
   the output buffer is connected to the trimming calibration circuit, to buffer the common grounded voltage, which is trimmed and calibrated by the trimming calibration circuit, of the battery pack cell,
   wherein the sampling unit comprises a sampling unit enable circuit, a high side bleeder circuit, a voltage-to-current circuit, and a voltage reduction circuit;
   the sampling unit enable circuit comprises an enable generation circuit, a first current source, and a second current source; the enable generation circuit is separately connected to the first current source and the second current source, to enable the first current source and the second current source; the first current source is configured to provide current for the voltage-to-current circuit, and the second current source is configured to provide current for the high side bleeder circuit;
   the high side bleeder circuit comprises a first voltage divider resistor string, a second voltage divider resistor string, and a mirror current source; after the first voltage divider resistor string, the second voltage divider resistor string, and the mirror current source are sequentially connected in series, two ends are separately connected to positive and negative input ends of the sampling unit;
   the voltage-to-current circuit comprises an operational amplifier, a PMOS transistor, and a third resistor; a positive input end of the operational amplifier is connected to a point, where the first voltage divider resistor string is connected to the second voltage divider resistor string; a negative input end of the operational amplifier is connected to a drain of the PMOS transistor; an output end of the operational 1 amplifier is connected to a gate of the PMOS transistor; a source of the PMOS transistor 2 is connected to the voltage reduction circuit; one end of the third resistor is connected to the positive input end of the sampling unit, and the other end of the third resistor is connected to the drain of the PMOS transistor; and
   the voltage reduction circuit comprises a fourth resistor, and one end of the fourth resistor is connected to the source of the PMOS transistor, and the other end of the fourth resistor is grounded.

2. The battery pack voltage detection system as in claim 1, wherein the level transfer circuit array comprises an enable generation circuit and several sampling units; the enable generation circuit is configured to generate an enable signal, which corresponds to a sampling unit, of a gated channel according to the battery pack cell gating signal; the sampling unit is configured to convert a battery pack cell voltage of the gated channel into a common grounded voltage according to the enable signal, which corresponds to the sampling unit, of the gated channel.

3. The battery pack voltage detection system as in claim 2, wherein positive and negative electrodes of the several sampling units are sequentially connected end to end, and the positive electrode and negative electrode of each battery pack cell are separately connected to positive and negative ends of a corresponding sampling unit.

4. The battery pack voltage detection system as in claim 1, wherein the trimming calibration circuit comprises a programmable calibration code register and a programmable gain amplifier; the programmable calibration code register is configured to store a trimming and calibration code of each channel; and the programmable gain amplifier is configured to correct the common grounded voltage of the battery pack cell according to amplified gain corresponding to the trimming and calibration code corresponding to the battery pack cell gating signal.

5. A battery pack voltage detection method, comprising the following steps:
   step S1, parsing, by a decoder, a battery pack cell gating signal;
   step S2, generating, by a level transfer circuit array, an enable signal, which corresponds to a sampling unit, of a gated channel according to the battery pack cell gating signal, and under control of the signal, converting a floating-bias voltage of a battery pack cell of the gated channel into a common grounded voltage;
   step S3, transmitting, by a multipath data selector, the converted common grounded voltage of the battery pack cell of the gated channel to a trimming calibration circuit according to a battery pack channel selection signal;
   step S4, correcting, by the trimming calibration circuit, the received common grounded voltage of the battery pack cell; and
   step S5, buffering, by an output buffer, the trimmed and calibrated common grounded voltage of the battery pack cell,
   wherein the sampling unit comprises a sampling unit enable circuit, a high side bleeder circuit, a voltage-to-current circuit, and a voltage reduction circuit;
   the sampling unit enable circuit comprises an enable generation circuit, a first current source, and a second current source; the enable generation circuit is separately connected to the first current source and the second current source, to enable the first current source and the second current source; the first current source is configured to provide current for the voltage-to-current circuit, and the second current source is configured for provide current to the high side bleeder circuit;

the high side bleeder circuit comprises a first voltage divider resistor string, a second voltage divider resistor string, and a mirror current source; after the first voltage divider resistor string, the second voltage divider resistor string, and the mirror current source are sequentially connected in series, two ends are separately connected to positive and negative input ends of the sampling unit;

the voltage-to-current circuit comprises an operational amplifier, a PMOS transistor, and a third resistor; a positive input end of the operational amplifier is connected to a point, where the first voltage divider resistor string is connected to the second voltage divider resistor string; a negative input end of the operational amplifier is connected to a drain of the PMOS transistor; an output end of the operational 1 amplifier is connected to a gate of the PMOS transistor: a source of the PMOS transistor 2 is connected to the voltage reduction circuit: one end of the third resistor is connected to the positive input end of the sampling unit, and the other end of the third resistor is connected to the drain of the PMOS transistor; and the voltage reduction circuit comprises a fourth resistor, and one end of the fourth resistor is connected to the source of the PMOS transistor, and the other end of the fourth resistor is grounded.

6. The battery pack voltage detection method as in claim 5, wherein the battery pack cell gating signal comprises a gating signal of a channel cell voltage, a low power consumption module signal, and a high speed sampling mode signal.

7. The battery pack voltage detection method as in claim 5, wherein the level transfer circuit array comprises an enable generation circuit and several sampling units; the enable generation circuit is configured to generate an enable signal, which corresponds to a sampling unit, of a gated channel according to the battery pack cell gating signal; the sampling unit is configured to convert a battery pack cell voltage of the gated channel into a common grounded voltage according to the enable signal, which corresponds to the sampling unit, of the gated channel; and the trimming calibration circuit comprises a programmable calibration code register and a programmable gain amplifier; the programmable calibration code register is configured to store a trimming and calibration code of each channel; and the programmable gain amplifier is configured to correct the common grounded voltage of the battery pack cell according to amplified gain corresponding to the trimming and calibration code corresponding to the battery pack cell gating signal.

8. The battery pack voltage detection method as in claim 5, wherein the common grounded voltage $V_{OUT}$, which is converted and obtained by the sampling unit, of the battery pack cell is:

$$V_{OUT} = V_{bat} \frac{R_{1214} \times R_{1219}}{(R_{1214} + R_{1215}) \times R_{1218}}$$

Vbat is a voltage value provided by a battery pack: $R_{1214}$, $R_{1215}$, $R_{1218}$, and $R_{1219}$ are respectively resistance values of the first voltage divider resistor string, the second voltage divider resistor string, the third resistor, and the fourth resistor.

* * * * *